United States Patent [19]

Olsson

[11] Patent Number: 4,947,134

[45] Date of Patent: Aug. 7, 1990

[54] LIGHTWAVE SYSTEMS USING OPTICAL AMPLIFIERS

[75] Inventor: Nils A. Olsson, New Providence, N.J.

[73] Assignee: American Telephone and Telegraph Company, New York, N.Y.

[21] Appl. No.: 115,143

[22] Filed: Oct. 30, 1987

[51] Int. Cl.$^5$ .................... H01L 15/00; H01S 2/20
[52] U.S. Cl. ........................ 330/4.3; 455/602
[58] Field of Search ............ 330/4.3; 357/19, 30; 350/96.13, 96.14; 455/601, 602

[56] References Cited

U.S. PATENT DOCUMENTS

| | | | |
|---|---|---|---|
| 3,571,737 | 3/1971 | Miller | 455/601 |
| 4,038,610 | 7/1977 | Nishizawa et al. | 330/4.3 |
| 4,571,576 | 2/1986 | Olsen et al. | 332/7.51 |
| 4,663,596 | 5/1987 | Heeks | 455/601 |
| 4,693,545 | 9/1987 | Henningsen et al. | 330/4.3 |
| 4,736,164 | 4/1988 | Henning | 330/4.3 |
| 4,794,346 | 12/1988 | Miller | 330/4.3 |

FOREIGN PATENT DOCUMENTS

0148436  9/1982  Japan .................. 455/601

OTHER PUBLICATIONS

K. Iwashita et al., *Electron Lett.*, vol. 22, pp. 791–792, (1986).
N. A. Olsson et al., *OFC/IOOC*, Reno, Nev., PDP8-1, pp. 32–35, (1987).
N. A. Olsson, *Electron Lett.*, vol. 21, pp. 1085–1087, (1985).
M. Shikada et al., *IOOC/ECOC*, Venice, Italy, pp. 49–52, (1985), vol. III.
R. C. Steel et al., *Electron Lett.*, vol. 23, pp. 296–297, (1987).
Y. Yamamoto, *IEEE J. Quantum Electron*, vol. QE-16, pp. 1073–1081, (1980).
G. Eisenstein et al., *Electron Lett.*, vol. 21, pp. 1076–1077, (1985).
I. W. Marshall et al., *Electron Lett.*, vol. 22, pp. 253–254, (1986).
Tsang et al., "Optoelectronic Logic . . . Lasers", 11/11/83, pp. 1621–1625, IEEE, J.Q.E., vol. QE-19, #11.
Temkin et al., "Reflection Noise . . . Lasers", 2/86, IEEE J.Q.E., vol. QE-22, #2, pp. 286–293.
Olsson et al., "An Optical Switching . . . Lasers", 4/84, IEEE J.Q.E., vol. QE-20, #4, pp. 332–334.
Mukai et al., "Gain, Frequency . . . Amplifiers", 6/81, IEEE J.Q.E., vol. QE-17, #6, pp. 1028–1034.

*Primary Examiner*—Nelson Moskowitz
*Attorney, Agent, or Firm*—Michael J. Urbano

[57] ABSTRACT

A single frequency lightwave system employs semiconductor, optical amplifiers arranged in tandem with suitable nose filtering and isolation between amplifier stages. Feedback control maintains overlap between the signal frequency and one of the passbands of the amplifiers. Either direct detection or coherent detection can be used. Also described is a receiver front end which includes such an amplifier between the incoming signal and a photodetector. Both transmission systems and switching systems are described.

19 Claims, 5 Drawing Sheets

LIGHTWAVE SYSTEMS USING OPTICAL AMPLIFIERS

BACKGROUND OF THE INVENTION

This invention relates to optical amplifiers and, more particularly, to lightwave systems and receivers utilizing such amplifiers.

The distance over which an optical signal can be transmitted on an optical fiber is a function of the loss and dispersion characteristics of the fiber, the spectral and power characteristics of the laser, and the number of optical amplifiers or electrical repeaters in the transmission path between transmitter and receiver. In conjunction with system specifications, these characteristics determine the spacing between the amplifiers or repeaters. Of course, it is well known that an optical amplifier amplifies the optical signal directly at optical frequencies, without converting it to a corresponding electrical signal, but an electrical repeater first converts the optical signal to an electrical analog, then regenerates the electrical signal before retransmitting it at an optical frequency.

A dispersion-limited signal (e.g., a signal matched to the 1.5 $\mu$m loss minimum of present fiber) typically requires regenerative repeating to increase the transmission distance and single longitudinal mode lasers to reduce dispersion effects, whereas a loss-limited singal (e.g., a signal matched to the 1.3 $\mu$m dispersion minimum of present fiber, or a single longitudinal mode signal at the 1.5 $\mu$m loss minimum) can use the much simpler technique of direct optical amplification.

It has been theoretically predicted that semiconductor laser chips, modified to function as optical amplifiers, can increase the transmission distance between regenerators in fiber optic transmission systems. (Y. Yamamoto, *IEEE J. Quantum Electron.*, Vol. QE-16, pp. 1073-1081 (1980)). Recent reports have not confirmed this prediction, but have demonstrated net gain (see, for example, G. Eisenstein et al, *Electron. Lett.*, Vol. 21, pp. 1076-1077 (1985)). Dual amplifier systems have been demonstrated both with direct detection (I. W. Marshall et al, *Electron. Lett.*, Vol. 22, pp. 253-254, (1986)) and coherent detection (N. A. Olsson, *Electron. Lett.*, Vol. 21, pp. 1085-1087 (1985)) with net amplifier gains of 26 dB and 21 dB, respectively. In a single amplifier phase shift keying (PSK) heterodyne experiment, a net amplifier gain of 8 dB was achieved (R. C. Steel et al, *Electron. Lett.*, Vol. 23, pp. 296-297 (1987)). However, using direct detection, the longest transmission distance, 171 km at 1.2 Gb/s, has been achieved by prior workers in a system which does not use optical amplifiers (M. Shikada et al, *IOOC/ECOC*, Venice, Italy, pp. 49-52 (1985)). Similarly, using coherent detection, the longest transmission distance did not use optical amplifiers and required unusually low loss fiber to attain 290 km at 400 Mbls (K. Iwashita et al, *Electron. Lett.*, Vol. 22, pp. 791-792 (1986)).

SUMMARY OF THE INVENTION

In contrast, in accordance with one aspect of the invention, four tandem optical amplifiers have been used to demonstrate the longest, non-regenerated transmission distances for both direct detection (313 km at 1 Gb/s) and coherent detection (372 km at 400 Mb/s). The amplifiers exhibited a large net gain of about 50,000×(47 dB) but only a small system penalty of about 1.5 dB.

In a lightwave system in accordance with one embodiment of the invention, a single frequency optical signal is amplified by means of a plurality of near-resonant, semiconductor, optical amplifiers arranged in tandem; that is, each of the amplifiers has a plurality of passbands at different frequencies, and the signal frequency is located in one of the passbands. Inasmuch as the amplifiers exhibit broadband spontaneous emission, noise filtering is included. One way to achieve such filtering is to utilize adjacent amplifiers of different lengths.

In preferred embodiments, feedback is employed to maintain overlap between one of the amplifier passbands and the signal frequency, and isolators are employed between amplifiers.

In other embodiments for use in wavelength division multiplexed (WDM) systems, a plurality of single frequency signals is arranged so that separate passbands of the amplifiers overlap separate ones of the signals, or so that they are all located within one passband.

The invention is useful both in transmission and switching system applications. In the latter case, optical amplifiers may be used to compensate for losses experienced by optical signals which traverse an optical switch. In particular, optical amplifiers and noise filtering according to the invention may be incorporated in the switched paths between tandem optical switches.

Yet another aspect of the invention is predicated upon the discovery that the noise figure of a semiconductor, optical amplifier varies considerably across the gain spectrum of the amplifier and, in fact, is lowest on the long wavelength (low frequency) side of the gain maximum. Both near-resonant and travelling-wave semiconductor amplifiers exhibit this characteristic. Thus, contrary to conventional wisdom which teaches that the signal frequency should be at the gain maximum, one embodiment of the invention exploits this discovery by designing the amplifier and operating the system so that the signal frequency is on the low frequency side of the gain maximum. This aspect is useful at all bit rates, but is particularly advantageous in high bit rate system (e.g., those operating above about 2 Gb/s, say at 6-8 Gb/s) where some prior art devices perform poorly (e.g., where the gain of avalanche photodiodes is significantly decreased). Therefore, another embodiment of the invention is a semiconductor, optical amplifier, designed so that the signal frequency is on the low frequency side of its gain maximum. In an optical receiver, such an amplifier could be interposed between the incoming signal and the photodetector (e.g., a p-i-n photodiode). In an optical switch, such an amplifier could be interposed between tandem optical switch stages.

BRIEF DESCRIPTION OF THE DRAWINGS

The invention, together with its various features and advantages, can be readily understood from the following more detailed description taken in conjunction with accompanying drawings, in which.

DETAILED DESCRIPTION

Figure 1:
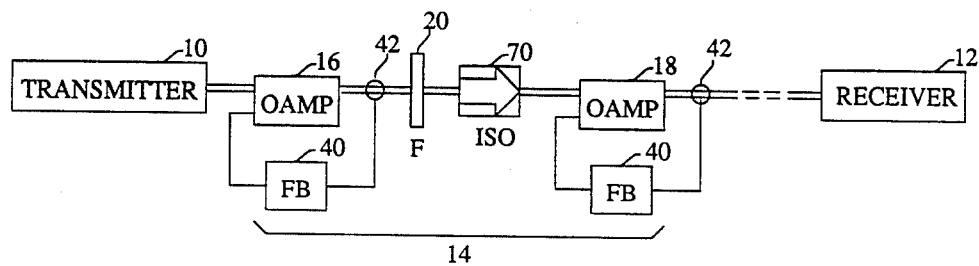
FIG. 1 is a schematic of a lightwave system using optical amplifiers in accordance with one embodiment of the invention.
Figure 2:
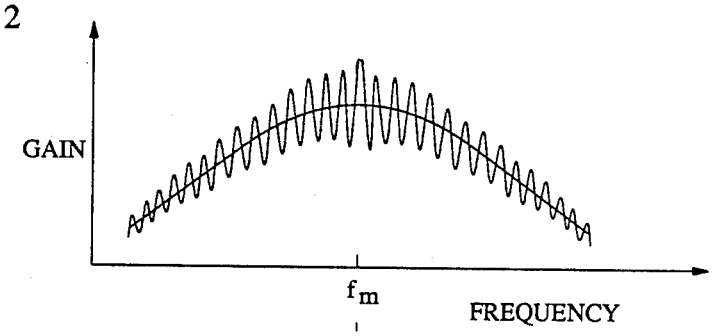
FIG. 2 shows the gain spectrum of a near-resonant, semiconductor, optical amplifier used in one embodiment of the system of FIG. 1.

FIG. 1 shows a lightwave communication system including a transmitter 10 which has a single longitudinal mode source (not shown) for generating an optical radiation signal at a first optical frequency $f_1$, a receiver 12 of the signal, and a fiber optic communication link 14 for carrying the signal from the transmitter to the receiver. The link 14 includes a plurality of near-resonant, semiconductor, optical amplifiers (OAMPs) arranged in tandem, only two such OAMPs 16 and 18 being shown for the purposes of illustration. As shown in FIG. 2, the gain spectrum of each of the OAMPs has an average gain curve (dashed line) with a maximum at $f_m$ and a plurality of passbands at different frequencies superimposed on the average gain curve. The near-resonant design of the amplifiers results in the peaks of the passbands being separated by c/2 nL, where c is the speed of light, n is the refractive index of the portion (e.g., waveguide) of the amplifier where the signal propagates, and L is the length of that portion. In addition, each of the passbands in the gain spectrum of FIG. 2 also represents frequencies at which the spontaneous emission of the amplifier is resonantly enhanced. The spontaneous emission constitutes noise and needs to be filtered in order to improve the signal-to-noise ratio of the system and to prevent noise generated by one amplifier from saturating another.

Figure 4:
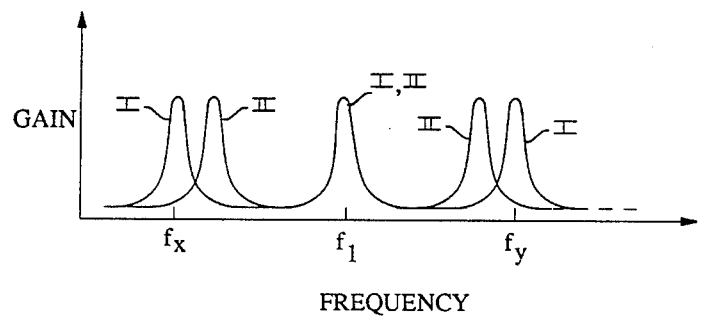
FIG. 4 shows an expanded segment of the spectrum of FIG. 2 for two amplifiers of different lengths; curve I shows the c/2 nL spacing of the resonant peaks for the longer amplifier; curve II for the shorter amplifier.

Noise filtering is illustratively performed by a frequency selective (e.g., narrow) band filter 20 positioned between the OAMPs 16 and 18. The filter 20 may take on several configurations. One design is essentially an optical grating tuned to pass the signal frequency and reject other frequencies, thereby effectively rejecting most of the frequency components of noise, which has a broadband spectrum. Another design amounts to a Fabry-Perot resonator, which can be formed in a fiber segment. A third alternative, and perhaps a simpler one, is to make the lengths of at least adjacent OAMPs different from one another so that most of the resonant peaks (modes) of their gain spectra, as shown in FIG. 4, do not overlap one another. In general, it is desirable to have overlapping modes at the signal frequency $f_1$ but to minimize the number of other modes which also overlap. To a first order approximation, the difference in length of adjacent amplifiers should produce a difference in frequency of the different amplifier modes nearest $f_1$ which is greater than the frequency width at half maximum (FWHM) of a single mode. A difference in length of only 10% may be adequate for amplifiers which are 450–500 $\mu$m long. In this case the segment of the spectrum shown by curve I might represent the spectrum of the shorter OAMP 16, whereas that of curve II represents the spectrum of longer OAMP 18. It is apparent that any noise component generated at frequencies $f_x$ or $f_y$ in OAMP 16 experiences much lower gain in OAMP 18. Hence, OAMP 18 tends not to saturate because the resonant peaks of curve II are shifted from those of curve I by virtue of the different lengths of the amplifiers, with one exception. That exception occurs at the signal frequency $f_1$ where the resonant peaks of curves I and II overlap one another in order to amplify the signal at that frequency. However, any noise in that passband will also be amplified, but the total amount of noise amplification through the system is substantially reduced by the filtering process of the shifted gain spectra.

Figure 5:
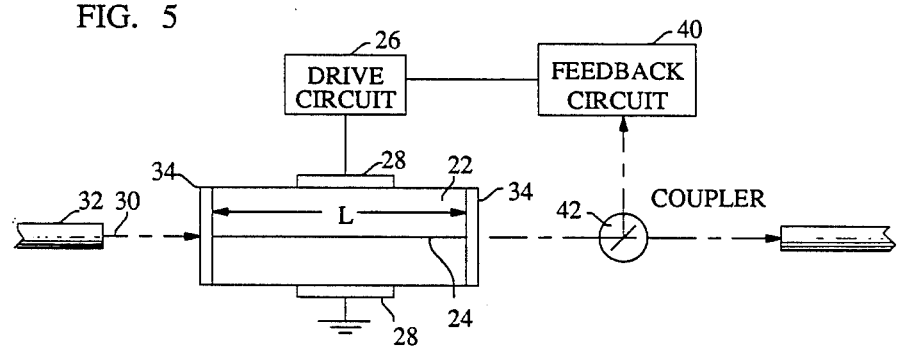
FIG. 5 is a schematic of a semiconductor optical amplifier useful in the embodiment of FIG. 1.

One embodiment of the optical amplifiers is shown in the schematic drawing of FIG. 5 where a semiconductor body 22 is provided with a waveguide 24 for guiding light to be propagated therethrough, antireflection (AR) coatings 34 on its input and output faces, and electrodes 28. When pumped by sufficient current supplied by drive circuit 26 connected across electrodes 28, the body 22 serves as a gain medium and hence will perform the function of amplifying a signal 30 illustratively emanating from a fiber 32. To perform this function effectively, lasing action is suppressed, for example, by AR coatings 34. In order to obtain the near-resonant characteristics of the gain spectrum of FIG. 2, the product of the single-pass gain G of the amplifier and the reflectivity R of the coatings 34 should be properly selected. In general, it is desirable that this product be kept relatively large; $0.3 \lesssim GR < 1$ is suitable.

In a practical embodiment of the transmission system, it is desirable to control the position of the passband relative to that of the signal frequency $f_1$. As shown in FIG. 5, this function is performed by the feedback circuit 40. Coupler 42 samples a portion of the amplified signal and supplies it as an input to circuit 40. The latter compares the power of the sample to a suitable reference in order to generate an error signal which is used to adjust the drive current applied by circuit 26 to the amplifier. Changes in drive current produces changes in the position of the passbands. Alternatively, the error signal may be used to adjust the drive current to a thermoelectric cooler (not shown) thermally coupled to the amplifier since changes in temperature also shift the passbands. On the other hand, instead of sensing the output power, the voltage across the amplifier may be measured. Since there is a dip in the voltage at maximum gain, this dip may be sensed to adjust the drive current or temperature, as above.

Figure 3:
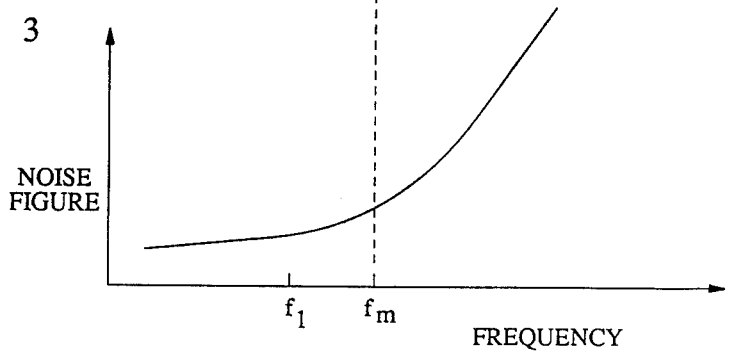
FIG. 3 show the variation of the noise figure of the amplifier across the gain spectrum of FIG. 2; a similar variation is observed for travelling-wave semiconductor amplifiers.

An amplifier of the type shown in FIG. 5 has several advantageous characteristics. First, the optical noise penalty of the amplifier is very small. Four such amplifiers in tandem produce a penalty of only 1.5 dB. Second, the noise figure F of the amplifier has been found to vary by more than a factor of two across its gain spectrum as shown in FIG. 3, being lower at frequencies below the frequency $f_m$ of the gain maximum. The noise figure is the ratio of the signal-to-noise ratio at the input of the amplifier to that at the output; since an amplifier always adds some noise to the system, F is always greater than one. As a consequence, it is preferable to design the amplifier and operate the system so that the signal frequency $f_1$ is on the low frequency side of the gain maximum; that is $f_1 < f_m$. If the signal frequency is preset, then the semiconductor material of the gain medium may be selected to satisfy $f_1 < f_m$. On the other hand, if the amplifier design is preset, then the transmitter design (e.g., laser source) may be adapted to generate a low enough signal frequency. Similar comments apply to other semiconductor optical amplifiers, such as those of the travelling-wave type, which also exhibit lower noise figures at frequencies below $f_m$. Moreover, a travelling-wave amplifier (which typically has GR as small as possible; $GR \lesssim 0.06$ is suitable) with $f_1 < f_m$ is also suitable for amplification of signals from multilongitudinal mode sources.

Figure 6:
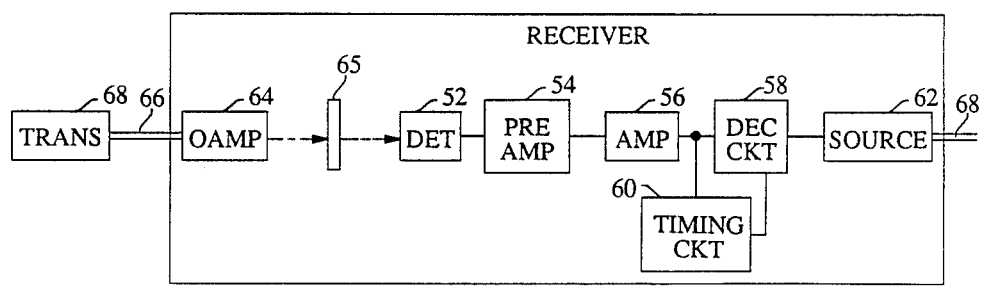
FIG. 6 is a schematic of a lightwave receiver incorporating an optical amplifier in the front-end thereof.

While the noise figure feature may be useful in any of the embodiments of the invention, it is especially suited for use in the front-end of a receiver; that is, where sensitivity is important and hence noise levels should be kept as low as possible. FIG. 6 depicts a relatively standard receiver from the electronic standpoint; that is, it includes a photodetector 52 such as a PIN photodiode, a preamplifier 54, a postamplifier 56, a decision circuit 58, and a timing circuit 60. If the receiver is to function as a repeater, the output of the decision circuit may be used to drive a light source (e.g., a laser) 62 coupled to an output fiber 68. Where regenerative repeating is not necessary, the source 62 is omitted and the detected electrical signal is coupled to a suitable utilization circuit (not shown). Of particular significance in this reciever is the use of an optical amplifier OAMP 64 between the transmission fiber 66 and the photodetector 52. The OAMP 64, in accordance with the discussion above, is designed so that the signal frequency is on the low frequency side of its gain maximum. Optionally, a narrow band noise filter 65 may also be used between OAMP 64 and photodetector 52. This particular configuration is especially suited to very high bit rate applications (e.g., above 2 GHz, say 6-8 GHz) where the gain of available avalanche photodiodes (APDs) may be inadequate. The OAMP 64, therefore, provides the necessary gain, obviates the need for an APD (and its attendant high voltage supply), and enables high sensitivity to be attained even at high bit rates.

Another aspect of the invention resides in the use of an optical isolator 70 between adjacent amplifiers in the transmission system as shown in FIG. 1. The isolators are, of course, well known in the art (e.g., Faraday rotation devices), but their function here is to prevent gain instability in an amplifier which could result from reflections of the amplified signal from splices or other discontinuities in the transmission path. In addition, isolators prevent the build-up of undesirable positive feedback which can result because the OAMPs amplify signals travelling in both directions.

Figure 7:
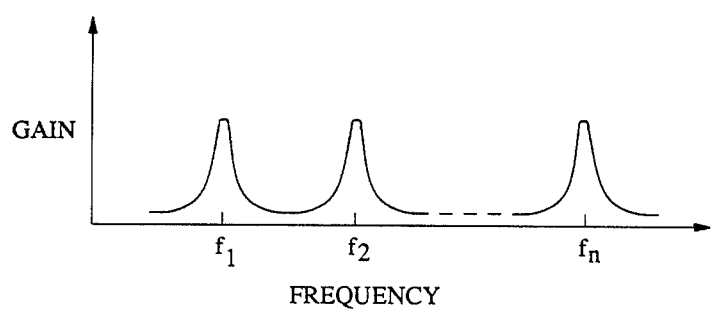
FIGS. 7 and 8 show segments of the gain spectra of near-resonant, semiconductor, optical amplifiers in relation to multiple frequencies generated by the transmitter of FIG. 1 for two cases: a separate single frequency in a plurality of passbands (FIG. 4), and a plurality of separate single frequencies in one passband (FIG. 5)

In yet another embodiment of the invention for use in a wavelength division multiplexed (WDM) system, the transmitter 10 of FIG. 1 illustratively generates a plurality of signals, each at a separate single frequency (or wavelength) such that, the separate frequencies $f_1, f_2, \ldots f_n$ are each located within separate ones of the passbands of the amplifiers as shown in FIG. 7. Illustratively, these bands are about 100 GHz (7 Å) apart, thus requiring signal sources, such as nominally 1.5 μm lasers operating at, say, 1.4993 μm, 1.500 μm, 1.5007 μm, etc. In this case, of course, the passbands of the amplifiers should overlap one another and hence noise filtering using different length amplifiers would be undesirable. Instead, noise filtering by means of optical gratings and Fabry-Perot filters would be more suitable.

Figure 8:
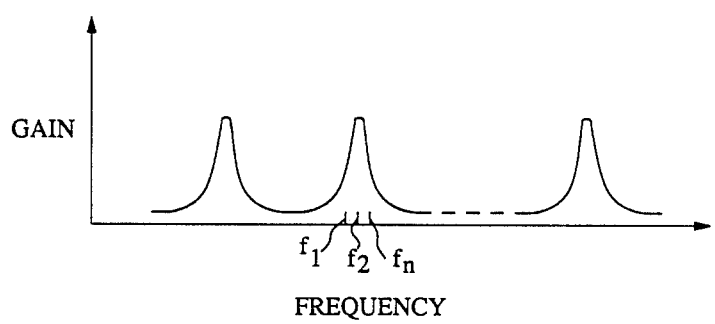

Alternatively, the separate frequency signals generated by transmitter 10 may be bunched within a single passband as shown in FIG. 8. Typically, approximately ten 1 GHz signals can be fit into a passband which is approximately 15 GHz wide (1.1 Å at the 3 dB points). However, sources so closely spaced in wavelength imply that this embodiment is primarily directed to coherent systems where heterodyne detection enables the signals to be resolved. Of course, in this case, the noise filtering scheme employing different length amplifiers would be suitable.

The following examples describe experiments performed to demonstrate various principles of the invention in the context of a direct detection scheme (Example I), as well as a coherent detection scheme (Example II). The various arrangements, devices, materials, dimensions, parameters, operating conditions, etc., are provided by way of illustration only and, unless otherwise indicated, are not intended to limit the scope of the invention.

EXAMPLE I

Figure 9:
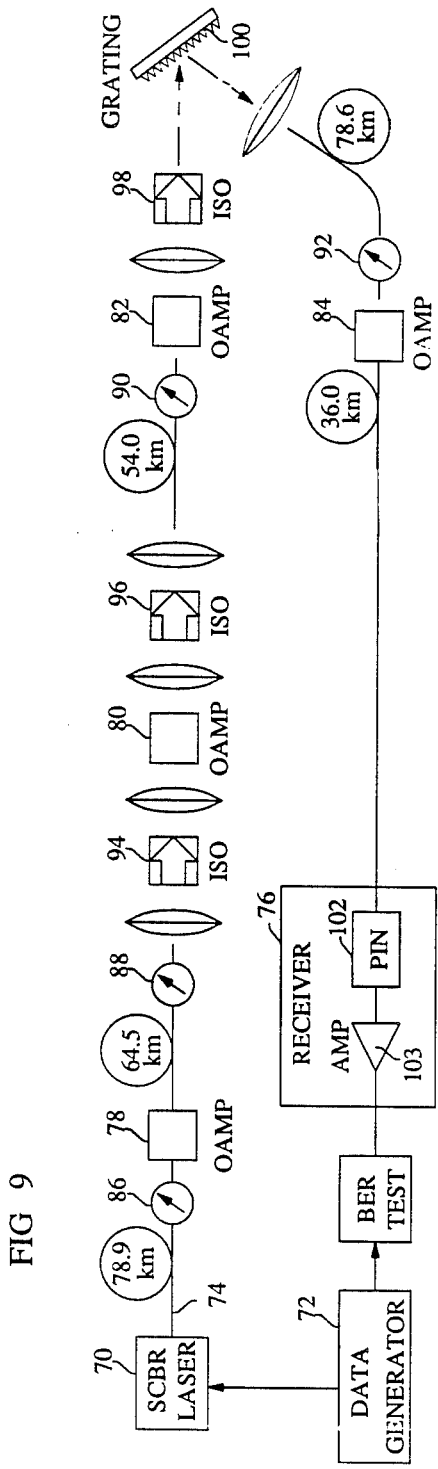
FIG. 9 is a schematic of an experimental lightwave system used to demonstrate the invention with direct detection.

A direct detection lightwave system is shown in FIG. 9. The signal light source was a SCBR-laser 70 emitting at a wavelength of 1.54 μm. The laser, as described by N. A. Olsson in *OFC/IOOC*, Reno, Nev., PDP8, pp. 32-35 (1987), comprised a conventional Fabry-Perot laser butt contact with an external Bragg reflector on a silicon chip. The threshold current was 23 mA, and the bias current used was 54 mA. Data generator 72 provided direct modulation through the lasing threshold via a NRZ $2^{15} - 1$ pseudo random, binary sequence signal at 1 Gb/s. The modulation current was 75 mA peak-to-peak and the resulting chirp of the laser output was less than 80 MHz/mA. The mean input power to the fiber 74 was ±0.2 dBm.

In total, 313.0 km of conventional, non-dispersion-shifted fiber was inserted between the laser and the receiver 76, with an accumulated loss (including splicing losses) of −69.9 dB, and a total dispersion of approximately 5 ns/nm. After each of various length fiber spools (78.9 km, 64.5 km, 54.0 km and 78.6 km), the signal level was amplified by an optical amplifier (78, 80, 82 and 84, respectively). Four InP/InGaAsP CSBH semiconductor laser chips with different length optical cavities (around 500 μm long) and quarterwavelength AR facet-coatings were used as the optical amplifiers. The first three amplifiers 78, 80, and 82 had facet reflectivities on the order of 0.5%, and their gain maxima were approximately 6 nm on the shorter wavelength side of the signal; that is, the signal frequency was less than $f_m$. On the other hand, for reasons of availability only, the last amplifier 84 had a facet reflectivity of about 3%, and the gain maximum coincided with the signal wavelength. The input signals to each of the amplifiers were TE-polarized by manual fiber polarizers 86, 88, 90 and 92, one of which was placed just before each amplifier. If the input signal were TM-polarized, the gain in an amplifier would decrease by approximately 7 dB. The fiber input powers of the four amplifiers were −18.4, −23.3, −23.7 and −19.6 dBm, respectively, and the fiber-to-fiber gains of the amplifiers were 7.9, 11.1, 14.2 and 7.7 dB, respectively. High input signals were used to enhance the signal-to-noise ratios at the amplifier outputs. The high input powers caused slight (1–2 dB) gain saturation in all amplifiers. Microscope objectives in combination with optical isolators or lensed fiber ends were used to couple the light into and out of the amplifiers. The total coupling loss fiber-to-fiber for each amplifier was estimated to be −10 dB, irrespective of the coupling method. Optical isolators 94, 96 and 98 were inserted between adjacent amplifiers. Amplifiers 80 and 82, which had isolators between themselves and the fiber spools, could be pumped harder, thus giving a higher net gain as compared to amplifiers 78 and 84, which had no isolators before the fiber spools.

Spontaneous emission noise from preceding amplifiers is amplified in succeeding ones. Eventually, the amplified noise will become larger than the signal and cause gain saturation in the amplifiers further along the transmission path. Also, the receiver performance might be degraded by spontaneous-spontaneous emission beat noise and saturation effects. To reduce these effects, a grating 100, acting as a wavelength filter, was inserted at the output of amplifier 98. The FWHM of the filter was 15 Å, and all spontaneous emission noise, except the passbands (Fabry-Perot modes) closest to the signal wavelength, were filtered out.

A PIN InGaAsP-diode 102 and an amplifier 103, which included an integrated GaAs transimpedance circuit, were used as the receiver. The bit-error-rate (BER) characteristics of the receiver at 1 Gb/s with direct detection were measured. Without any fiber or amplifiers, the receiver sensitivity (BER=$10^{-9}$) was −30.5 dBm. With 313 km of fiber and four optical amplifiers, the receiver sensitivity degraded by only 1.4 dB to −29.1 dBm, without any sign of an error floor (i.e., saturation in the BER at higher received powers). The degradation was caused by the combined effects of signal-spontaneous beat noise, pattern effects due to gain saturation in the amplifiers, and dispersion. The penalty from spontaneous-spontaneous beat noise was negligible. The quality of the received signal after 313 km of transmission as shown by an eye-diagram was excellent.

This example demonstrated the use of four laser amplifiers to transmit a 1 Gb/s directly modulated signal through segments of conventional, non-dispersion-shifted fiber over a total distance of 313 km. This is the longest non-generative fiber transmission using direct modulation demonstrated to date. The low chirp of the SCBR-laser source makes the non-generative, optical amplification attractive, and thus the total transmission distance was significantly expanded by 176 km beyond prior work. Using an optical isolator between adjacent amplifiers is important for good system performance. However, it would also be advantageous to use another isolator between each amplifier and each fiber spool, thereby reducing feedback into each amplifier due to Rayleigh and splice reflections from the fiber. The optical wavelength filter 100 was used to reduce the amplified spontaneous emission built up in the amplifier chain, thus reducing the gain saturation in the succeeding amplifiers. However, this additional wavelength filtering was not essential for the system behavior. The use of multiple optical amplifiers and long transmission distance resulted in only 1.4 dB degradation in receiver sensitivity.

EXAMPLE II

Figure 10:
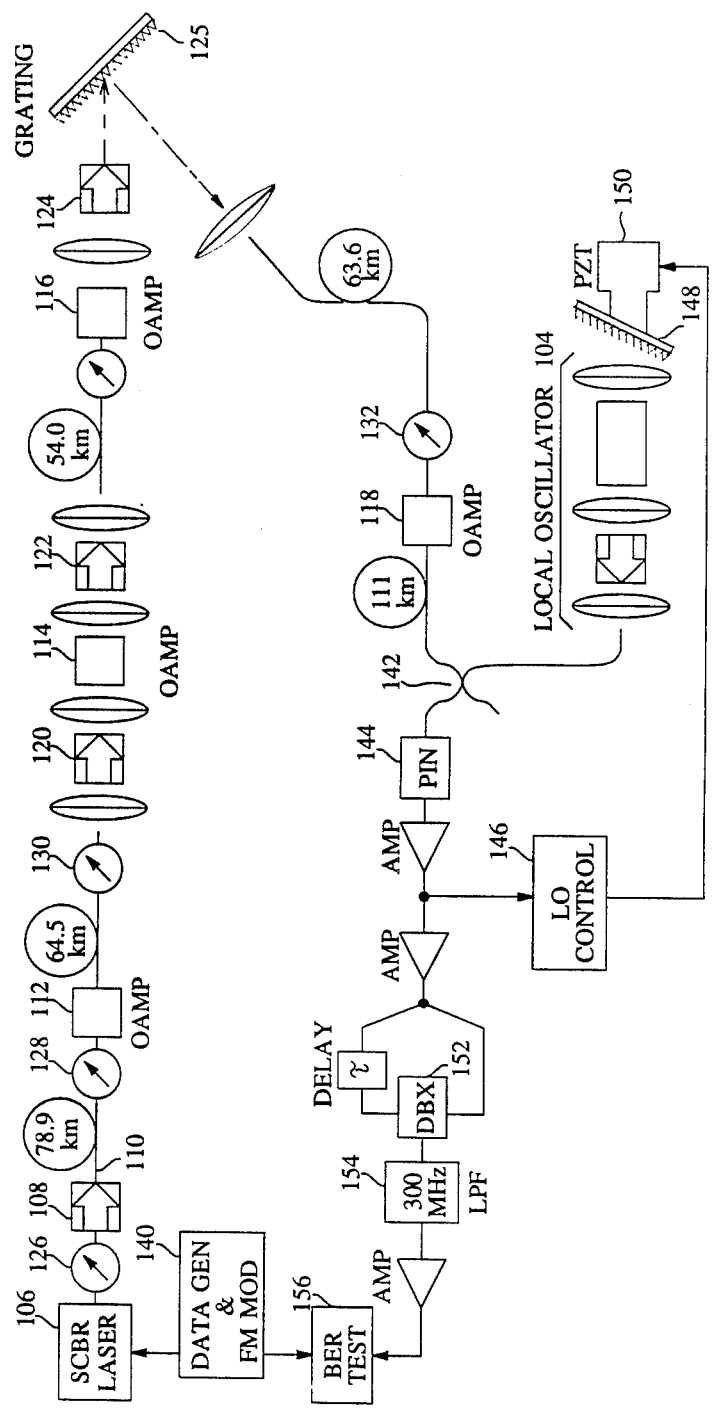
FIG. 10 is a schematic of an experimental lightwave system used to demonstrate the invention with coherent detection.

This example describes a 400 Mb/s coherent detection system which used frequency shift keying (FSK) with a frequency shift of about 410 MHz and a IF frequency of 800 MHz. As shown in FIG. 10, the output from a single frequency, tunable, external cavity laser was used as the local oscillator 104. The baseline (no amplifiers) receiver sensitivity was −50.0 dBm or 192 photons/bit. The total fiber loss, including losses in approximately 75 splices, was 83.9 dB or 0.225 dB/km.

The transmitter laser 106 comprised a silicon chip Bragg reflector (SCBR) laser of the type used in Example I. Besides its narrow linewidth (less than 1 MHz), a principal advantage of this laser in coherent systems is its uniform FM response under direct current modulation. The frequency deviation was approximately 80 MHz/mA and essentially flat in the 100 kHz to 1 GHz modulation frequency range. The laser was biased at 70.5 mA and was directly frequency modulated with a 5.2 mA peak-to-peak $2^{15}-1$ NRZ pseudo random bit stream at 400 Mb/s from data generator 140. A measured power of −2.6 dBm at a wavelength of 1.538 μm was launched into a fiber segment 112 (pigtail) coupled to the laser package. An optical isolator 108 was inserted between the pigtail and the transmission fiber 112 to decouple the laser from optical reflections in the fiber and from spontaneous emission noise from the first amplifier 112.

The four optical amplifiers 112, 114, 116 and 118 were made from quarter-wavelength AR coated CSBH laser chips having different cavity lengths (around 500 μm) as in Example I. Because the fourth amplifier 118 had a residual reflectivity of about 3% (due to availability only), it had a narrower bandwidth, and thus the drive current and device temperature had to be more precisely controlled than the other amplifiers. The 3 dB optical bandwidth of amplifiers 112, 114 and 116, under the operating condition used in the system, was approximately 15 GHz.

Amplifiers 112 and 118 were coupled to the system using lensed fiber pigtails both at their inputs and their outputs. Amplifiers 114 was coupled using collimating and refocusing lenses and optical isolators 120 and 122 between the amplifier and its input and output fibers. Amplifier 116 used a lensed fiber pigtail at its input and lenses at its output end. A grating spectral filter 125 was also inserted between amplifiers 116 and 118. The bandwidth of this filter was 15 Å. The total input and output coupling loss was estimated to be 10 dB per amplifier. The net gains for the four amplifiers, as used in the system experiment, were 11.0 dB, 13.6 dB, 12.7 dB, and 10.4 dB, respectively. Manual polarization adjusters 126, 128, 130 and 132 were inserted before each amplifier and were adjusted to give a TE input. The TE gain was approximately 7 dB higher than the TM gain.

A fiber coupler was used to couple the signal from OAMP 118 and that of LO 104 into a p-i-n photodiode 144. The IF signal at the output of the photodiode was amplified and split, first to LO control circuit 146 which adjusted the position of grating mirror 148 by means of piezoelectric transducer PZT 150, and second to double balanced mixer DBX 152 the output which was passed through a 300 MHz low pass filter LPF 154 to a BER test set 156.

To reduce the effects of spontaneous emission noise, the optical amplifiers should operate with as high an input power as possible. The maximum input power, however, is limited by gain saturation. The input powers (measured in the input fiber) of amplifiers 112, 114, 116 and 118 were −24.6 dBm, −26.6 dBm, −24.3 dBm, and −26.2 dBm, respectively. At these input powers the gain was only slightly (1-2 dB) saturated. The 372 km of fiber was distributed as follows: 78.9 km before amplifier 112, 64.5 km between amplifiers 112 and 114, 54 km between amplifiers 114 and 116, 63.6 km between amplifiers 116 and 118, and 111 km between amplifier 118 and the receiver.

A baseline system performance was established by measuring the bit-error-rate (BER) as a function of received power with only a short section of fiber (78.9 km) and no amplifiers. This measurement gave a receiver sensitivity of −50 dBm. Using the full length (372 km) of fiber and the four amplifiers, a received power of −48.5 dBm was required for a $10^{-9}$ BER, hence the penalty was only 1.5 dB. With increasing received power, the BER decreases without any evidence of an error floor.

In a coherent system with tandem amplifiers, the main excess noise source is the local oscillator (LO) spontaneous emission beat noise. In this experiment, this noise source added 1.8 dB to the LO shot noise giving a total of 5 dB of optical noise above the receiver thermal noise. The 1.8 dB of additional noise over the LO shot noise is quite consistent with the 1.5 dB penalty stated above. For unknown reasons, most of the excess noise originated from amplifier 114. As mentioned before, optical isolators were inserted between adjacent amplifiers to achieve stable operation. These isolators mainly eliminate cross-interaction between the amplifiers. However, the best performance was obtained when an isolator was also deployed between the amplifier and the fiber (as for amplifier 114), thereby reducing feedback from Rayleigh and splice scattering from the fiber.

In conclusion, this experiment demonstrated 400 Mb/s coherent FSK transmission over 372 km of fiber using a SCBR laser light source and 4 tandem optical amplifiers. With a total amplifier gain of 87.7 dB, a net gain of 47.7 dB was achieved giving an overall system gain of 89.6 dB. The low penalty and high gain associated with the optical amplifiers clearly demonstrates their usefulness in fiber optic communication systems.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the experiments of Examples I and II utilized polarization adjusters, the need for these elements can be obviated by employing polarization insensitive amplifiers and isolators.

Moreover, while the optical amplifiers described above may be used as substitutes for optoelectronic repeaters, they may also be used as adjuncts thereto. For example, optical amplification may be used an extended distance, but if dispersion builds up too much, a repeater may be necessary or desirable. Once regenerated, optical amplification may be utilized over an additional extended distance, and so on.

Alternatively, where separate fibers are used for different channels, space limitations in a repeater housing may prohibit the use of separate repeaters, which tend to be bulky, in the same housing. In such cases an optical amplifier could be substituted for a repeater in one channel. In a similar fashion, at the next repeater station an optical amplifier could be substituted for a repeater in the other channel. Thus, regeneration and optical amplification would occur at alternate stations in alternate channels.

Figure 11:
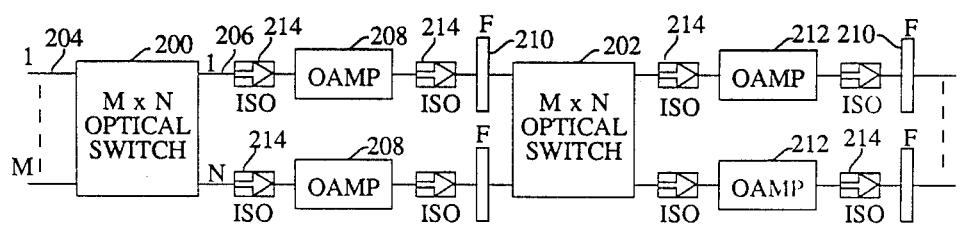
FIG. 11 is schematic of an optical switching system in accordance with yet another embodiment of the invention.

Another application contemplates the use of optical amplifiers to compensate for losses in optical switches. FIG. 11 shows a plurality of such switches 200 and 202 arranged in tandem. Only two switches are shown for simplicity, and each is designated generically as an $M \times N$ switch; that is, each switch includes means for selectively making connections between M input paths 204 and N output paths 206. (Both blocking and non-blocking switches are contemplated.) Illustratively, the switching elements of the switching stages include lithium niobate optical switches. Interposed between switches is a plurality of OAMPs 208, designed in accordance with the invention, to amplify the output signals of one switch 200 before they reach the next switch 202. As before, noise filters 210 are preferably positioned at the outputs of OAMPs 208 so that noise does not saturate the OAMPs 212 which follow the second switch 202. Of course, optical isolators 214 may be used at the input and output of each amplifier.

I claim:

1. In an optical communication system including a transmitter having a single longitudinal mode source for generating an optical radiation signal at a first optical frequency, a receiver of said signal, and a fiber optic communication link for carrying said signal from said transmitter to said receiver, amplification apparatus comprising
   a plurality of semiconductor optical amplifiers of said signal arranged in tandem within said link, each of said amplifiers having no significant degree of gain saturation and having a plurality of passbands at different frequencies and generating spontaneous emission noise within said passbands, said first frequency being located in one of said passbands, and
   frequency selective filter means for reducing the amount of said noise, generated in any one of said amplifiers outside said one passband, which is amplified in another of said amplifiers,
   each of said amplifiers having a gain spectrum which exhibits a gain maximum at a frequency $f_m$ which is greater than said first frequency so that each of said amplifiers experiences a lower noise figure than it would if said first frequency were equal to $f_m$.

2. In an optical communication system including a transmitter having a single longitudinal mode source for generating an optical radiation signal at a first optical frequency, a receiver of said signal, and a fiber optic communication link for carrying said signal from said transmitter to said receiver, amplification apparatus comprising
   a plurality of semiconductor optical amplifiers of said signal arranged in tandem within said link, each of said amplifiers having a plurality of passbands at different frequencies and generating spontaneous emission noise within said passbands, said first frequency being located in one of said passbands, and
   at least two adjacent ones of said amplifiers having sufficiently different lengths so as to reduce the amount of said noise, generated in one of said two amplifiers outside said one passband, which is amplified in the other of said two amplifiers.

3. The apparatus of claim 2 wherein each of said amplifiers has a gain spectrum which exhibits a gain maximum at a frequency $f_m$ which is greater than said first frequency.

4. In an optical communication system including a transmitter having a single longitudinal mode source for generating an optical radiation signal at a first optical frequency, a receiver of said signal, and a fiber optic communication link for carrying said signal from said transmitter to said receiver, amplification apparatus comprising a plurality of semiconductor optical amplifiers of said signal arranged in tandem within said link, each of said amplifiers having no significant degree of gain saturation and having a plurality of passbands at different frequencies and generating spontaneous emission noise within said passbands, said first frequency being located in one of said passbands, feedback means for controlling said amplifiers so that said one passband of each of said amplifiers overlaps said first frequency, isolation means for preventing any substantial radiation transmitted through one of said amplifiers from re-entering said one amplifier, and frequency selective filter means for reducing the amount of said noise, generated in any one of said amplifiers outside said one passband, which is amplified in another of said amplifiers, each of said amplifiers having a gain spectrum which exhibits a gain maximum at a frequency $f_m$ which is greater than said first frequency so that each of said amplifiers experiences a lower noise figure than it would if said first frequency were equal to $f_m$.

5. The apparatus of claim 4 wherein said transmitter has source means for generating a plurality of optical radiation signals each at a different optical frequency, and the frequencies of all of said signals are located in said one passband.

6. The apparatus of claim 4 wherein said transmitter has source means for generating a plurality of optical radiation signals each at a different optical frequency, the frequencies of all of said signals are located in different ones of said passbands, and said filter means prevents any substantial amount of said noise generated in one of said amplifiers outside said passbands containing said signals from being amplified in another of said amplifiers.

7. A system comprising a single longitudinal mode semiconductor laser source which generates an optical radiation signal at a first optical frequency, a plurality of semiconductor optical amplifiers of said signal, each of said amplifiers having no significant degree of gain saturation and having a plurality of passbands at different frequencies and generating spontaneous emission noise within said passbands, said first frequency being located in one of said passbands.

feedback means for controlling said amplifiers so that said one passband of each of said amplifiers overlaps said first frequency, isolation means for preventing any substantial radiation transmitted through any one of said amplifiers from re-entering said one amplifier, frequency selective filter means for reducing the amount of said noise, generated in any one of said amplifiers outside said one passband, which is amplified in another of said amplifiers, and a receiver for detecting said amplified signal, each of said amplifiers having a gain spectrum which exhibits a gain maximum at a frequency $f_m$ which is greater than said first frequency so that each of said amplifiers experiences a lower noise figure than it would if said first frequency were equal to $f_m$.

8. A receiver of an optical radiation signal at a first frequency comprising a semiconductor optical amplifier of said signal, said amplifier having no significant degree of gain saturation and having a gain spectrum characterized by a gain maximum at a frequency $f_m$ which is greater than said first frequency so that each of said amplifiers experiences a lower noise figure that it would if said first frequency were equal to $f_m$, and means for converting the amplified optical signal at said first frequency to an electrical signal.

9. The receiver of claim 8 further including means disposed between said amplifier and said converting means for filtering noise from said amplified optical signal before it is converted to an electrical signal.

10. The receiver of claim 9 wherein said convering means comprises a photodiode.

11. The receiver of claim 10 further including means for amplifying said electrical signal.

12. An amplifier of an optical signal at a first optical frequency comprising a semiconductor gain medium through which said signal propagates, said medium having no significant degree of gain saturation and having a gain spectrum characterized by a gain maximum at a frequency $f_m$ which is greater than said first frequency so that each of said amplifiers experiences a lower noise figure than it would if said first frequency were equal to $f_m$, and means for pumping said medium to produce gain.

13. The amplifier of claim 12 wherein said medium includes a waveguide for guiding said signal.

14. The amplifier of claim 13 wherein said medium comprises InGaAsP.

15. The amplifier of claim 12 wherein said medium includes input and output coatings such that the single-pass gain G of the medium and the reflectivity R of the coatings satisfies the inequality $0.3 \lesssim GR < 1$ and said signal is generated by a single longitudinal mode source.

16. The amplifier of claim 12 wherein said medium includes input and output coatings such that the gain G of the medium and reflectivity R of the coatings satisfies the inequality $GR \lesssim 0.06$ and said signal is generated by a multi-longitudinal mode source.

17. An optical switching system comprising an optical switch having at least one optical input path carrying a signal at a first optical frequency, and at least one optical output path, and means for selectively connecting said at least one input path to said at least one output path, and semiconductor optical amplifiers for amplifying said signal at said first frequency which are coupled to each of said at least one output paths, each of said amplifiers having no significant degree of gain saturation and having a semiconductor gain medium characterized by a gain spectrum with a gain maximum at a frequency $f_m$ which is greater than said first frequency so that each of said amplifiers experiences a lower noise figure than it would if said first frequency were equal to $f_m$.

18. The system of claim 17 further including
a plurality of said switches coupled to one another and a plurality of said amplifiers disposed between said switches,
each of said amplifiers having a plurality of passbands at different frequencies and generating spontaneous emission noise within said passbands, said first frequency being located in one of said passbands, and frequency selective filter means for reducing the amount of said noise, generated in any one of said amplifiers outside of said one passband, which is amplified in another of said amplifiers.

19. The system of claim 18 wherein said filter means comprises at least two adjacent ones of said amplifiers having sufficiently different lengths to reduce said noise.

* * * * *